(12) United States Patent
Han et al.

(10) Patent No.: US 11,469,051 B2
(45) Date of Patent: Oct. 11, 2022

(54) MULTILAYER CAPACITOR AND BOARD HAVING THE SAME MOUNTED THEREON

(71) Applicant: SAMSUNG ELECTRO-MECHANICS CO., LTD., Suwon-si (KR)

(72) Inventors: Ji Hye Han, Suwon-si (KR); Jung Min Kim, Suwon-si (KR); Jae Seok Yi, Suwon-si (KR); Hye Jin Park, Suwon-si (KR); Byung Woo Kang, Suwon-si (KR); Jeong Ryeol Kim, Suwon-si (KR); Bon Seok Koo, Suwon-si (KR); Il Ro Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/233,235

(22) Filed: Apr. 16, 2021

(65) Prior Publication Data
US 2022/0093337 A1    Mar. 24, 2022

(30) Foreign Application Priority Data
Sep. 24, 2020   (KR) .......................... 10-2020-0124224

(51) Int. Cl.
| | |
|---|---|
| *H01G 4/30* | (2006.01) |
| *H01G 4/012* | (2006.01) |
| *H05K 1/18* | (2006.01) |
| *H01G 4/12* | (2006.01) |
| *H01G 4/248* | (2006.01) |

(52) U.S. Cl.
CPC ............... *H01G 4/30* (2013.01); *H01G 4/012* (2013.01); *H01G 4/12* (2013.01); *H01G 4/248* (2013.01); *H05K 1/181* (2013.01); *H05K 2201/10015* (2013.01)

(58) Field of Classification Search
CPC ....................................................... H01G 4/30
USPC ......................................................... 174/260
See application file for complete search history.

(56) References Cited

U.S. PATENT DOCUMENTS

| | | | |
|---|---|---|---|
| 10,361,035 B1* | 7/2019 | Song ........................ | H01G 4/30 |
| 2014/0085767 A1 | 3/2014 | Kang | |
| 2017/0301468 A1* | 10/2017 | Kim ....................... | H01G 4/232 |

(Continued)

FOREIGN PATENT DOCUMENTS

| | | |
|---|---|---|
| KR | 10-2004761 B1 | 7/2019 |
| KR | 10-2061509 B1 | 1/2020 |

*Primary Examiner* — Stanley Tso
(74) *Attorney, Agent, or Firm* — Morgan, Lewis & Bockius LLP

(57) ABSTRACT

A multilayer capacitor includes a capacitor body including first to six surfaces, and including a dielectric layer, first and second internal electrodes, and first and second external electrodes. The first and second external electrodes include first and second sintered layers, and first and second plating layers, respectively. An insulating layer is disposed on the capacitor body, to cover an end portion of a first band portion of the first sintered layer and an end portion of a second band portion of the second sintered layer, and has a maximum thickness of 10 μm or more. A portion of the first band portion of the first sintered layer is exposed from the insulating layer. A portion of the second band portion of the second sintered layer is exposed from the insulating layer.

17 Claims, 9 Drawing Sheets

(56) References Cited

U.S. PATENT DOCUMENTS

| | | | | |
|---|---|---|---|---|
| 2017/0323725 A1* | 11/2017 | Iso | ........................... | H01F 41/12 |
| 2017/0352482 A1* | 12/2017 | Park | ........................ | H01G 4/30 |
| 2019/0287728 A1* | 9/2019 | Cho | ....................... | H05K 7/142 |
| 2021/0020377 A1* | 1/2021 | Kurosu | .................. | H01G 2/065 |

* cited by examiner

MULTILAYER CAPACITOR AND BOARD HAVING THE SAME MOUNTED THEREON

CROSS-REFERENCE TO RELATED APPLICATION(S)

This application claims benefit of priority to Korean Patent Application No. 10-2020-0124224 filed on Sep. 24, 2020 in the Korean Intellectual Property Office, the disclosure of which is incorporated herein by reference in its entirety.

TECHNICAL FIELD

The present disclosure relates to a multilayer capacitor and a substrate having the same mounted thereon.

BACKGROUND

Recently, as electronics and IT industry technologies have developed, demand for passive components having improved performance and reliability is increasing.

In particular, the electronics industry is demanding reliability in strong mechanical stress environments due to characteristics of industry products, and according to this trend, demand for products, such as multilayer capacitors, having a certain level of warpage strength, is increasing.

SUMMARY

An aspect of the present disclosure is to provide a multilayer capacitor having improved warpage strength characteristics and a mounting substrate thereof.

According to an aspect of the present disclosure, a multilayer capacitor includes: a capacitor body including first and second surfaces opposing each other, third and fourth surfaces connected to the first and second surfaces and opposing each other, and fifth and sixth surfaces connected to the first and second surfaces, connected to the third and fourth surfaces, and opposing each other, and including a dielectric layer alternately stacked in a first direction, connecting the first and second surfaces, a first internal electrode exposed through the third surface, and a second internal electrode exposed through the fourth surface; and first and second external electrodes respectively disposed on both end portions of the capacitor body in a second direction, connecting the third and fourth surfaces and including first and second sintered layers respectively connected to the first and second internal electrodes, and first and second plating layers respectively disposed above the first and second sintered layers, respectively. The insulating layer may have a maximum thickness of 10 µm or more A portion of the first band portion of the first sintered layer may be exposed from the insulating layer. A portion of the second band portion of the second sintered layer may be exposed from the insulating layer.

In an embodiment of the present disclosure, the first sintered layer may include: a first connection portion disposed on a third surface of the capacitor body, and the first band portion extending from the first connection portion to portions of the first, second, fifth, and sixth surfaces of the capacitor body. The second sintered layer may include a second connection portion disposed on a fourth surface of the capacitor body, and the second band portion extending from the second connection portion to portions of the first, second, fifth, and sixth surfaces of the capacitor body.

In an embodiment of the present disclosure, a space between the first connection portion and the first band portion is defined as a first corner portion in the first sintered layer, and a space between the second connection portion and the second band portion is defined as a second corner portion in the first sintered layer. The first corner portion may be in contact with the first plating layer, and the second corner portion may be in contact with the second plating layer.

In an embodiment of the present disclosure, the first plating layer may be disposed on a portion, of the first connection portion and the first band portion, exposed from the insulating layer, and the second plating layer may be disposed on a portion, of the second connection portion and the second band portion, exposed from the insulating layer.

In an embodiment of the present disclosure, an end portion of the first band portion may be exposed from the first plating layer and may be covered by the insulating layer, and an end portion of the second band portion may be exposed from the second plating layer and may be covered by the insulating layer. Both end portions of the insulating layer may be in contact with the first and second plating layers, respectively.

In an embodiment of the present disclosure, a first conductive resin layer covering the first sintered layer and one end portion of the insulating layer, and a second conductive resin layer covering the second sintered layer and the other end portion of the insulating layer may be further included, and the first and second plating layers may be disposed to cover the first and second conductive resin layers, respectively.

In an embodiment of the present disclosure, the first and second conductive resin layers may include a conductive metal and a base resin.

In an embodiment of the present disclosure, the first and second conductive resin layers may include a plurality of metal particles, an intermetallic compound, and a base resin.

According to another aspect of the present disclosure, a mounting substrate of a multilayer capacitor includes: a substrate having first and second electrode pads on an upper surface; and a multilayer capacitor mounted on the mounting substrate such that first and second plating layers are connected to the first and second electrode pads one by one.

According to another aspect of the present disclosure, a multilayer capacitor includes: a capacitor body including first and second surfaces opposing each other, third and fourth surfaces connected to the first and second surfaces and opposing each other, and fifth and sixth surfaces connected to the first and second surfaces, connected to the third and fourth surfaces, and opposing each other, and including a dielectric layer alternately stacked in a first direction connecting the first and second surfaces, a first internal electrode exposed through the third surface, and a second internal electrode exposed through the fourth surface; first and second external electrodes respectively disposed on both end portions of the capacitor body, in a second direction connecting the third and fourth surfaces, and comprising first and second sintered layers respectively connected to the first and second internal electrodes, and first and second plating layers respectively disposed above the first and second sintered layers, respectively; and an insulating layer disposed on the capacitor body, to cover an end portion of a first band portion of the first sintered layer and an end portion of a second band portion of the second sintered layer. A portion of the first band portion of the first sintered layer may be exposed from the insulating layer. A portion of the second band portion of the second sintered layer may be exposed from the insulating layer. A portion of the insulating layer, located at a center portion in the second direction, may have a thickness greater than a maximum thickness of the first band portion of the first sintered layer or a maximum thickness of the second band portion of the second sintered layer.

In an embodiment of the present disclosure, the thickness of the portion of the insulating layer, located at the center portion in the second direction, may be 10 µm or more.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
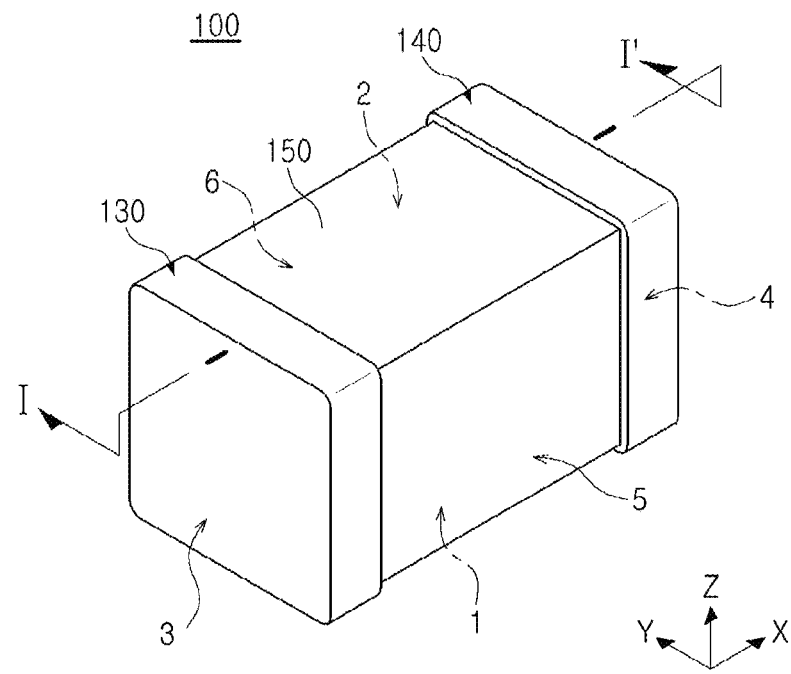
FIG. 1 is a schematic perspective diagram of a multilayer capacitor according to an embodiment of the present disclosure.

Hereinafter, embodiments of the present disclosure will be described in detail with reference to the accompanying drawings.

The present disclosure may, however, be exemplified in many different forms and should not be construed as being limited to the specific embodiments set forth herein.

Rather, these embodiments are provided so that this disclosure will be thorough and complete, and will fully convey the scope of the disclosure to those skilled in the art.

In the drawings, the shapes and dimensions of elements may be exaggerated for clarity.

Further, in the drawings, elements having the same functions within the same scope of the inventive concept will be designated by the same reference numerals.

Throughout the specification, when a component is referred to as "comprise" or "comprising," it means that it may include other components as well, rather than excluding other components, unless specifically stated otherwise.

Hereinafter, when a direction of a capacitor body 110 is defined to clearly explain an embodiment in the present disclosure, X, Y and Z shown in figures represent a length direction, a width direction and a thickness direction of the capacitor body 110, respectively.

Figure 2:
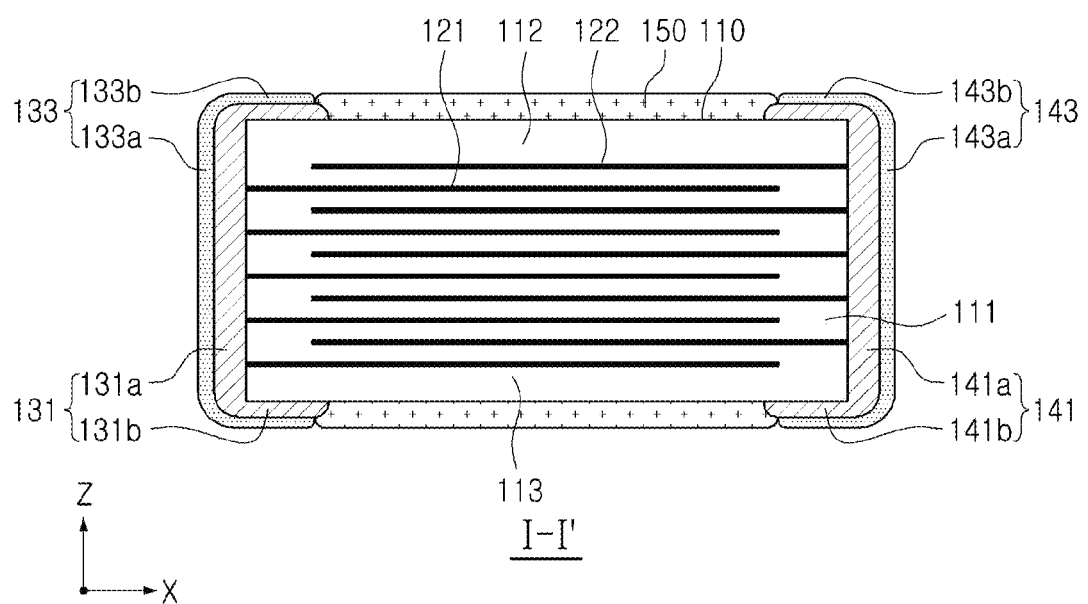
FIG. 2 is a cross-sectional diagram taken along line I-I' of FIG. 1.
Figure 3A:
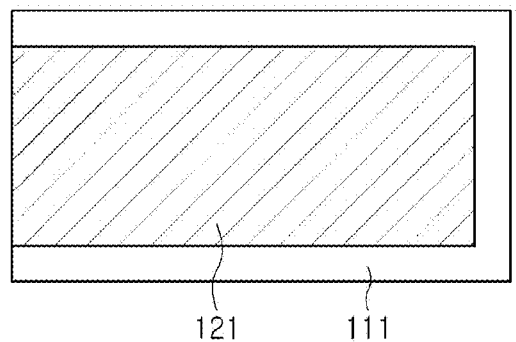
FIGS. 3A to 3B are plan views illustrating a dielectric layer and first and second internal electrodes of the multilayer capacitor of FIG. 1.
Figure 3B:
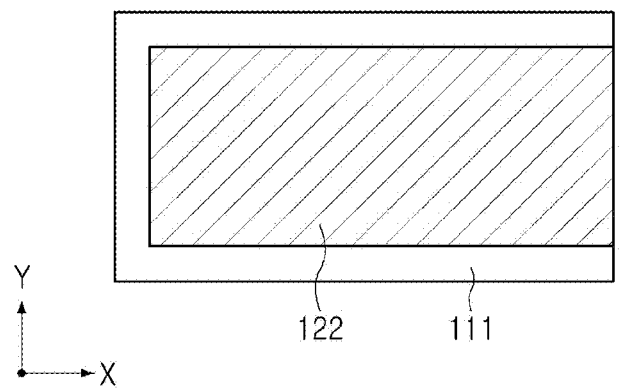

FIG. 1 is a schematic perspective diagram of a multilayer capacitor according to an embodiment of the present disclosure, FIG. 2 is a cross-sectional diagram taken along line I-I' of FIG. 1, and FIGS. 3A to 3B are plan views illustrating first and second dielectric layers and first and second internal electrodes of the multilayer capacitor of FIG. 1.

Referring to FIGS. 1 to 3B, a multilayer capacitor 100 according to the present disclosure includes a capacitor body 110, first and second external electrodes 130 and 140, and an insulating layer 150.

The capacitor body 110 is formed by laminating a plurality of dielectric layers 111 and then sintering the plurality of dielectric layers 111, and boundaries between the adjacent dielectric layers 111 may be integrated, such that they may be difficult to confirm without using a scanning electron microscope (SEM).

In this case, the capacitor body 110 may have a generally hexahedral shape, but the present disclosure is not limited thereto. In addition, the shape and dimensions of the capacitor body 110 and the number of laminated layers of the dielectric layer 111 are not limited to those illustrated in the drawings of the present embodiment.

In the present embodiment, for convenience of explanation, both surfaces of the capacitor body 110 opposing each other in the Z direction are defined as first and second surfaces 1 and 2, both surfaces connected to the first and second surfaces 1 and 2 and opposing each other in the X direction are defined as third and fourth surfaces 3 and 4, and both surfaces connected to the first and second surfaces 1 and 2, connected to the third and fourth surfaces 3 and 4 and opposing each other in the Y direction are defined as fifth and sixth surfaces 5 and 6.

The dielectric layer 111 may include a ceramic material having a high dielectric constant, for example, barium titanate ($BaTiO_3$)-based ceramic powder, strontium titanate ($SrTiO_3$)-based ceramic powder, or the like. However, the present disclosure is not limited thereto as long as sufficient capacitance may be obtained therewith.

In addition, a ceramic additive, an organic solvent, a plasticizer, a binding agent, a dispersant, and the like, may further be added to the dielectric layer 111, together with the ceramic powder.

As the ceramic additive, for example, a transition metal oxide or a transition metal carbide, a rare earth element, magnesium (Mg), aluminum (Al), or the like, may be used.

The capacitor body 110 may include an active region serving as a part contributing to capacitance formation of the capacitor and upper and lower cover portions respectively formed above and below the active region as the upper and lower margin portions.

The upper and lower cover regions may have the same material and configuration as the dielectric layer 111 except for not including internal electrodes.

The upper and lower cover regions may be formed by laminating a single dielectric layer or two or more dielectric layers on the upper and lower surfaces of the active region in the Z direction, respectively, and may prevent damage to internal electrodes due to physical or chemical stress.

The capacitor body 110 includes a first internal electrode 121 and a second internal electrode 122.

The first and second internal electrodes 121 and 122 are electrodes to which different polarities are applied, may be formed on one surface of the dielectric layer 111, respectively, and one end of the first internal electrode 121 may be exposed through the third surface 3 of the capacitor body 110 to be connected to a first external electrode 130, and one end of the second internal electrode 122 may be exposed through the fourth surface 4 of the capacitor body 110 to be connected to a second external electrode 140.

In this case, the first and second internal electrodes 121 and 122 may be electrically insulated from each other by the dielectric layer 111 disposed in the middle.

According to the above configuration, when a predetermined voltage is applied to the first and second external electrodes 131 and 132, charges are accumulated between the first and second internal electrodes 121 and 122.

In this case, capacitance of the multilayer capacitor 100 is proportional to an area of overlap of the first and second internal electrodes 121 and 122 superimposed on each other in the Z direction in the active region.

In addition, a material for forming the first and second internal electrodes 121 and 122 is not particularly limited, and may be formed by using for example, a noble metal material such as platinum (Pt), palladium (Pd), an alloy of palladium-silver (Pd—Ag), and the like, and a conductive paste made of one or more materials of nickel (Ni) and copper (Cu).

In this case, the conductive paste may be printed by a screen-printing method, a gravure printing method, or the like but the present disclosure is not limited thereto.

The first and second external electrodes 130 and 140 are provided with voltages having different polarities, may be disposed on both end portions of the capacitor body 110 in the X direction, and may respectively be connected to the exposed portions of the first and second internal electrodes 121 and 122 and may be electrically connected.

The first external electrode 130 includes a first sintered layer 131 and a first plating layer 133.

The first sintered layer 131 may be formed by applying a paste including conductive metal to one end portion of the capacitor body 110 in the X direction and sintering.

The conductive metal may be, for example, copper (Cu), silver (Ag), nickel (Ni), and alloys thereof, and the present disclosure is not limited thereto.

In addition, the first sintered layer 131 may be formed using an atomic layer deposition (ALD) method, a molecular layer deposition (MLD) method, a chemical vapor deposition (CVD) method, a sputtering method, or the like.

Alternatively, the first sintered layer 131 may be formed by transferring a sheet including a conductive metal onto the capacitor body 110.

The first sintered layer 131 may include a first connection portion 131a and a first band portion 131b.

The first connection portion 131a may be formed on the third surface 3 of the capacitor body 110 and be connected to the exposed portion of the first internal electrode 121.

The first band portion 131b may extend from the first connection portion 131a to portions of the first, second, fifth and sixth surfaces 1, 2, 5, and 6 of the capacitor body 110.

The first plating layer 133 may be disposed above the first sintered layer 131, and may include a third connection portion 133a and a third band portion 133b.

The third connection portion 133a may be formed above the first connection portion 131a of the first sintered layer 131, and the third band portion 133b may extend from the third connection portion 133a to the first band portion 131b of the first sintered layer 131.

The first plating layer 133 may be a Ni plating layer or a Sn plating layer, and may be formed to have a shape in which a Ni plating layer and a Sn plating layer are sequentially formed on the first sintered layer 131, and if necessary, may include a plurality of Ni plating layers and/or a plurality of Sn plating layers. However, the present disclosure is not limited thereto.

The second sintered layer 140 may include a second connection portion 141 and a second band portion 143.

The second sintered layer 131 may be formed by applying a paste including conductive metal to one end portion of the capacitor body 110 in the X direction and sintering.

The conductive metal may be, for example, copper (Cu), silver (Ag), nickel (Ni), and alloys thereof, and the present disclosure is not limited thereto.

In addition, the second sintered layer 141 may be formed using an atomic layer deposition (ALD) method, a molecular layer deposition (MLD) method, a chemical vapor deposition (CVD) method, a sputtering method, or the like.

Alternatively, the second sintered layer 141 may be formed by transferring a sheet including conductive metal onto the capacitor body 110.

The second sintered layer 141 may include a second connection portion 141a and a second band portion 141b.

The second connection portion 141a may be formed on the fourth surface 4 of the capacitor body 110 and be connected to the exposed portion of the second internal electrode 122.

The second band portion 141b may extend from the second connection portion 141a to portions of the first, second, fifth and sixth surfaces 1, 2, 5, and 6 of the capacitor body 110.

The second plating layer 143 may be disposed above the second sintered layer 141, and may include a fourth connection portion 143a and a fourth band portion 143b.

The fourth connection portion 143a may be formed above the second connection portion 141a of the second sintered layer 141, and the fourth band portion 143b may extend from the fourth connection portion 143a to the second band portion 141b of the second sintered layer 141.

The second plating layer 143 may be a Ni plating layer or a Sn plating layer, and may be formed to have a shape in which a Ni plating layer and a Sn plating layer are sequentially formed on the second sintered layer, and if necessary, may include a plurality of Ni plating layers and/or a plurality of Sn plating layers. However, the present disclosure is not limited thereto.

The insulating layer 150 may be formed on the capacitor body 110 to cover an end portion of the first band portion 131b of the first sintered layer 131 and an end portion of the second band portion 141b of the second sintered layer 141.

The insulating layer 150 may be disposed to cover all of the first, second, fifth and sixth surfaces 1, 2, 5, and 6 of the capacitor body 110, and may be formed to have a strip shape, for example.

In addition, the insulating layer 150 may be formed to have a generally flat surface, or may be formed to be convex outwardly, or may alternatively be formed to be concave inwardly.

Figure 4:
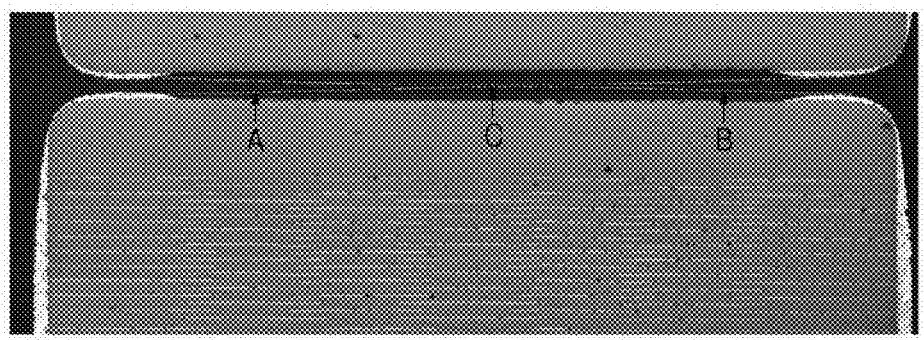
FIG. 4 is a photograph illustrating an embodiment of an insulating layer.

The shape of the insulating layer 150 may be determined according to the thickness in each position of the insulating layer 150. For example, as in FIG. 4, when the thickness of portions A and B, close to the first and second external electrodes is smaller than the thickness in a portion C, located in a central portion of the capacitor body, the insulating layer 150 may be convex outwardly.

If the thickness of A and B is greater than C, the insulating layer may be concave inwardly, and if the thickness of A, B, and C is similar, the insulating layer may have a generally flat shape.

The insulating layer 150 may serve to block a path for moisture penetration into the capacitor body 110 to improve moisture resistance reliability.

In addition, when the substrate is deformed by thermal or physical shock while the multilayer capacitor 100 is mounted on the substrate, stress may be generated, and the stress may be prevented from being transmitted to the capacitor body 110 and may serve to prevent cracking of the capacitor body 110.

In this case, the insulating layer 150 may have a thickness of 10 μm or more. Here, the thickness of the insulating layer 150 is based on the thickest portion overall.

When a maximum thickness of the insulating layer 150 is less than 10 μm, cracks may occur in the capacitor body 110.

In addition, when the maximum thickness of the insulating layer 150 is 10 μm or more, curvature of the capacitor body 110 may be reduced, so that even if the multilayer capacitor 100 is used for a high voltage, an effect of reducing an arc discharge can be expected. The maximum thickness of the insulating layer 150 or the like may be measured in a cross-sectional cut of the capacitor 100 in a X direction-Z direction plane, for example. In one example, the cross-sectional cut may cross a central portion of the capacitor 100 in the Y direction. The thickness of the insulating layer 150 may be determined by defining a predetermined number (e.g., 5) of points to the left and the predetermined number (e.g., 5) of points to the right from a reference center point of the insulating layer 150 at equal intervals (or non-equal intervals, alternatively), measuring a thickness of each of the points at equal intervals (or non-equal intervals, alternatively), and selecting the maximum one among the thicknesses of the multiple measurements. The reference center point may be at a central region in the cross-sectional cut. Alternatively, the maximum thickness of the insulating layer 150 may be a thickness at a central portion of the cross-sectional cut. The measurement may be performed through a scanning electron microscope (SEM), for example. Other methods and/or tools appreciated by one of ordinary skill in the art, even if not described in the present disclosure, may also be used.

In this case, the length of the first sintered layer 131 in the X direction from the first band portion 131b is formed to be longer than the length in the X direction covering the first band portion 131b from the insulating layer 150, and the length of the second sintered layer 141 in the X direction from the second band portion 141b is formed to be longer than the length in the X direction covering the second band portion 141b from the insulating layer 150.

Accordingly, regions, not covered by the insulating layer 150, are provided in the first and second band portions 131b and 141b, respectively.

In the present embodiment, a third band portion 133b of the first plating layer 133 is disposed to be in direct contact with a portion above the first band portion 131b, not covered by the insulating layer 150.

A fourth band portion 143b of the second plating layer 143 is disposed to be directly in contact with a portion above the second band portion 141b, not covered by the insulating layer 150.

Accordingly, an end portion of the first band portion 131b may be exposed without being covered by the third band portion 133b of the first plating layer 133 and may be covered by the insulating layer 150, and an end portion of the second band portion 141b may be exposed without being covered by the fourth band portion 143b of the second plating layer 143 and may be covered by the insulating layer 150.

That is, when a space between the first connection portion 131a and the first band portion 131b is defined as a first corner portion in the first sintered layer 131, and when a space between the second connection portion 141a and the second band portion 141b is defined as a second corner portion in the second sintered layer 141, the insulating layer 150 may not cover the first and second corner portions, the first corner portion may be covered while being in direct contact with the first plating layer 133, and the second corner portion may be covered while being in direct contact with the second plating layer 143.

In this case, one end portion of the insulating layer 150 may be in contact with an end portion the third band portion 133b of the first plating layer 133, and the other end portion of the insulating layer 150 may be in contact with an end portion of the fourth band portion 143b of the second plating layer 143.

Accordingly, since the first and second sintered layers 131 and 141 are not exposed externally, deterioration in reliability of the multilayer capacitor 100 can be prevented.

When the substrate on which the multilayer capacitor is mounted is pressed, stress may be applied to the multilayer capacitor as the substrate is bent, and the warpage strength characteristic can be defined as a pressing depth when there is no internal damage and a corresponding characteristic change of the multilayer capacitor.

In the external electrode including the conventional sintered-type electrode layer, an electrode layer may be formed by mixing metal powder and a binder.

The sintered-type electrode layer has an advantage of excellent electrical connection with the internal electrode, but has low ductility and is vulnerable to mechanical stress, resulting in low warpage strength characteristics.

In order to improve the mechanical reliability of the multilayer capacitor, the external electrode may be configured by applying a conductive resin layer on the sintered type electrode layer.

Such a conductive resin layer has higher ductility than that of a sintered electrode, so that the mechanical properties of the multilayer capacitor can be improved, but even in this case, there is still a difficult problem in satisfying a standard for electronic components that require higher reliability.

If the length of the band portion of the external electrode is lengthened, the reliability of the multilayer capacitor can be improved, but in this case, a probability of a short may increase as a distance between the two external electrodes becomes narrow, the probability of a short may increase.

In the multilayer capacitor of the present embodiment, an insulating layer may be disposed to surround the capacitor body, so that mechanical properties of the multilayer capacitor may be improved.

In this case, the insulating layer may be formed to cover a portion of the first and second sintered layers of the first and second external electrodes between the first and second external electrodes on an outer surface of the capacitor body to be directly connected to the first and second external electrodes.

Further, the insulating layer may cover the end portions of the first and second band portions of the first and second sintered layers of the first and second external electrodes.

In this case, a portion of the first and second band portions may not be covered by the insulating layer, and a portion of the first and second plating layers may be in direct contact with the portion of the first and second band portions.

Due to this structure, in the present embodiment, mechanical stress applied to the multilayer capacitor from the substrate through the external electrode can be reduced, and the warpage strength characteristics of the multilayer capacitor can be further improved.

In addition, since some of the first and second sintered layers are not covered by the insulating layer and are formed to be in direct contact with the first and second plating layers, respectively, electrical connectivity of the first and second external electrodes can be secured at a certain level or higher.

Therefore, even if the lengths of the first and second band portions in the first and second sintered layers are not significantly increased, electrical connectivity of the external electrode and the warpage strength characteristics of the multilayer capacitor can be secured at a certain level or higher, and the probability of occurrence of a short that may occur when the first and second band portions of the layer touch each other can be effectively reduced.

Figure 5:
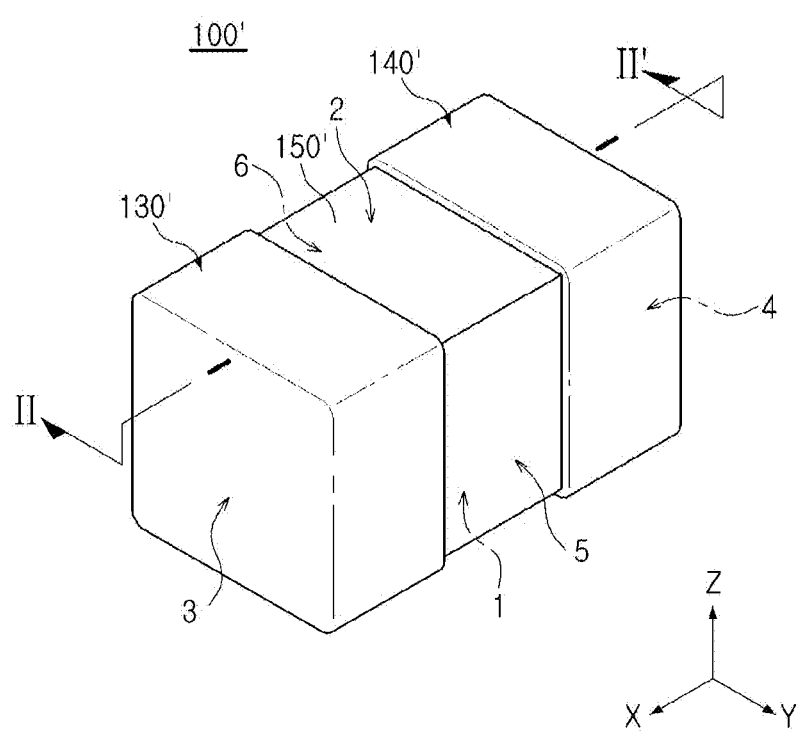
FIG. 5 is a schematic perspective diagram of a multilayer capacitor according to another embodiment of the present disclosure.
Figure 6:
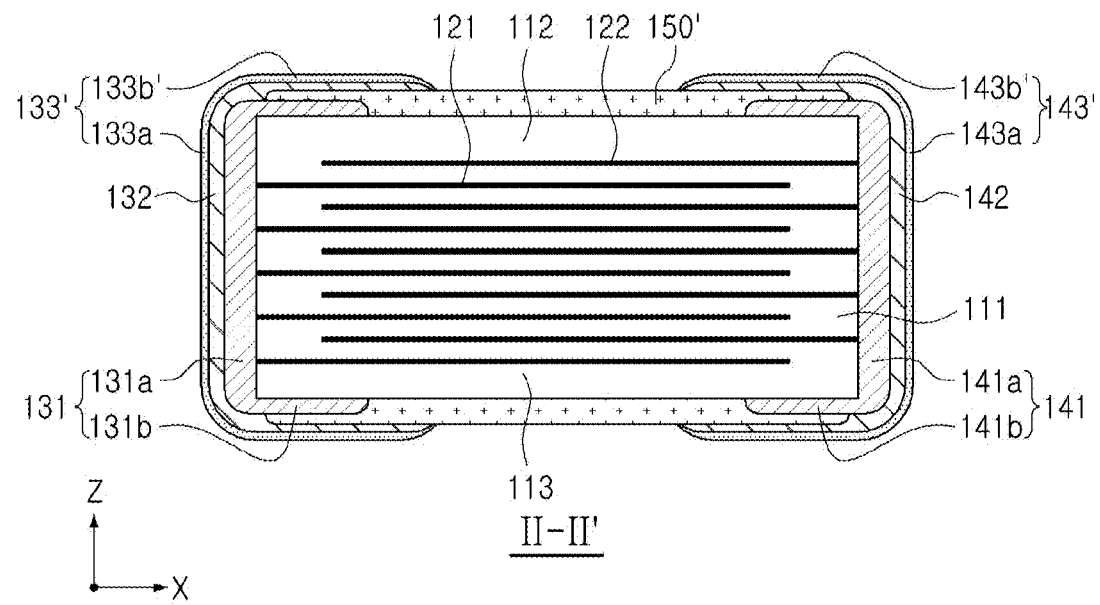
FIG. 6 is a cross-sectional diagram taken along line II-II' of FIG. 5.

FIG. 5 is a perspective diagram schematically illustrating a multilayer capacitor according to another embodiment of the present disclosure, and FIG. 6 is a cross-sectional diagram taken along line II-II' of FIG. 5.

Referring to FIGS. 5 and 6, in a multilayer capacitor 100' according to the present embodiment, first and second external electrodes 130' and 140' may further include first and second conductive resin layers 132 and 142.

The first and second conductive resin layers 132 and 142 may serve to protect the multilayer capacitor 100' by absorbing impact from the outside, and may have excellent elongation, thereby improving the warpage strength characteristics of the multilayer capacitor 100'.

In the present embodiment, the first conductive resin layer 132 may cover the first sintered layer 131 and one end portion of the insulating layer 150'.

Accordingly, one end portion of the insulating layer 150' may be disposed between the first band portion 131$b$ of the first sintered layer 131 and an end portion of the first conductive resin layer 132.

The first conductive resin layer 132 may include conductive metal and a base resin.

In this case, the conductive metal may be one of copper, silver, nickel, and alloys thereof, and the present disclosure is not limited thereto.

The base resin may be a thermosetting resin, for example, may include an epoxy resin, but the present disclosure is not limited thereto.

The second conductive resin layer 142 may cover the second sintered layer 141 and the other end portion of the insulating layer 150'.

Accordingly, the other end portion of the insulating layer 150' may be disposed between the second band portion 141$b$ of the second sintered layer 132 and an end portion of the second conductive resin layer 142.

The second conductive resin layer 142 may include conductive metal and a base resin.

In this case, the conductive metal may be one of copper, silver, nickel, and alloys thereof, and the present disclosure is not limited thereto.

The base resin may be a thermosetting resin, for example, may include an epoxy resin, but the present disclosure is not limited thereto.

As another example, the first and second conductive resin layers 132 and 142 may include a plurality of metal particles, an intermetallic compound, and a base resin.

The intermetallic compound may serve to improve electrical connectivity by connecting a plurality of metal particles, and may surround the plurality of metal particles and connect them to each other.

In this case, the intermetallic compound may include metal having a melting point, lower than a curing temperature of a base resin.

That is, since the intermetallic compound includes metal having a melting point, lower than the curing temperature of the base resin, the metal having a melting point, lower than the curing temperature of the base resin may be melted during the drying and curing process, and an intermetallic compound may be formed with a part of the metal particles to surround the metal particles.

In this case, the intermetallic compound may preferably include metal having a low melting point of 300° C. or lower.

For example, the intermetallic compound may include Sn having a melting point of 213 to 220° C. During the drying and curing process, Sn may be melted, and the molten Sn may wet metal particles having a high melting point such as Ag, Ni or Cu with a capillary phenomenon, and may react with a portion of the Ag, Ni or Cu metal particles to form intermetallic compounds such as $Ag_3Sn$, $Ni_3Sn_4$, $Cu_6Sn_5$ and $Cu_3Sn$.

In this case, Ag, Ni, or Cu, not consumed in the reaction, remains in the form of metal particles.

Accordingly, the plurality of metal particles may include one or more of Ag, Ni, and Cu, and the intermetallic compound may include one or more of $Ag_3Sn$, $Ni_3Sn_4$, $Cu_6Sn_5$, and $Cu_3Sn$.

The first and second plating layers 133' and 143' may be disposed to cover the first and second conductive resin layers 132 and 142, respectively.

End portions of the third and fourth band portions 133$b'$ and 143$b'$ of the first and second plating layers 132 and 142 may be positioned above the insulating layer 150', respectively.

Accordingly, since the first and second sintered layers 131 and 141 are not exposed externally, deterioration of reliability may be prevented.

Meanwhile, the insulating layer 150' may be formed of a resin having elasticity. For example, the insulating layer 150' may be an epoxy resin as a polymer material, and as another example, the insulating layer 150' may further include one or more of silica, alumina, glass, and zirconium dioxide (ZrO2), which are fillers, but the present disclosure is not limited thereto. The material of the insulating layer 150' may be used to form the insulating layer 150 described above.

The filler may be further added in an amount of 0.1 weight % to the insulating layer 150' in order to improve heat resistance and coating properties of the polymer.

Figure 11:
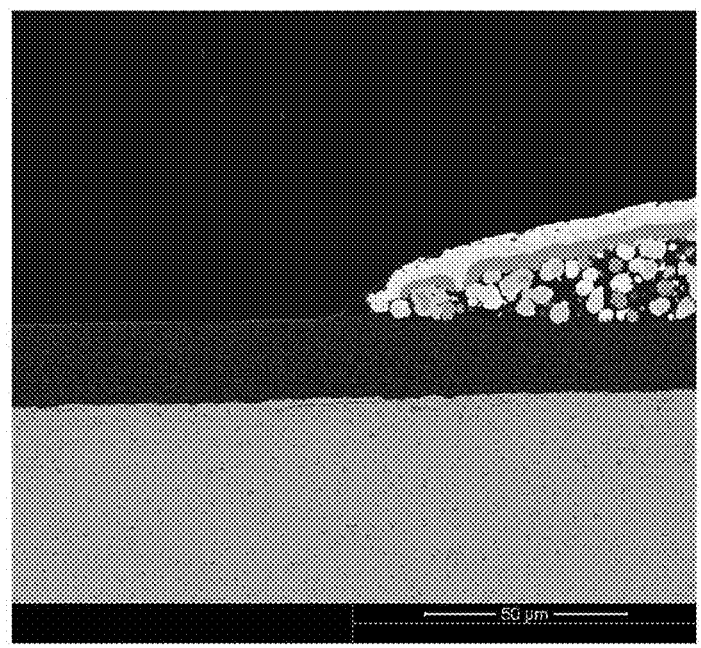
FIG. 11 is an SEM photograph illustrating a cross-section of an insulating layer in a multilayer capacitor according to an embodiment of the present disclosure.

Referring to a photograph in FIG. 11, it can be seen that a filler is included in an insulating layer. In FIG. 11, the lowermost portion is an insulating layer, a portion formed above the insulating layer is a conductive resin layer, and a portion formed above the conductive resin layer is a plating layer.

Figure 7:
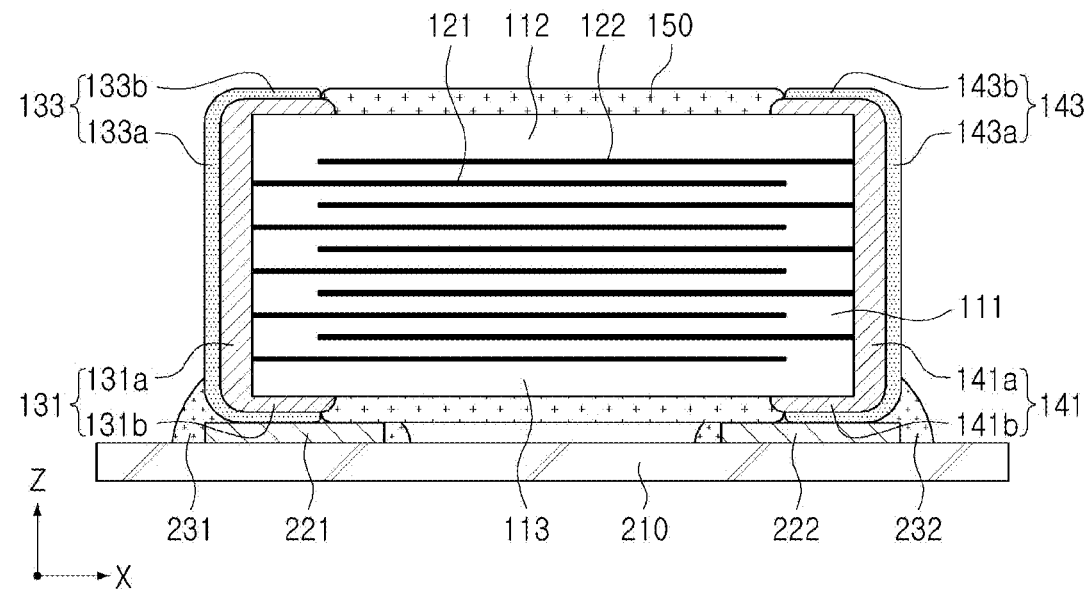
FIG. 7 is a cross-sectional diagram illustrating a state in which a multilayer capacitor according to an embodiment of the present disclosure is mounted on a substrate.

FIG. 7 is a cross-sectional view illustrating a state in which a multilayer capacitor according to an embodiment of the present disclosure is mounted on a substrate.

Referring to FIG. 7, a mounting substrate according to the present embodiment includes a substrate 210 and first and second electrode pads 221 and 222 disposed on an upper surface of the substrate 210 to be spaced apart from each other in the X direction.

In this case, the multilayer capacitor 100 is connected in a state so that first and second plating layers 133 and 144 of the first and second external electrodes 130 and 140 are in contact with the first and second electrode pads 221 and 222, respectively, and mounted on the substrate 210.

The first plating layer 133 may be bonded to the first electrode pad 221 by solder 231 to be electrically and physically connected, and the second plating layer 143 may be bonded to the second electrode pad 222 by solder 232 to be electrically and physically connected.

Figure 9:
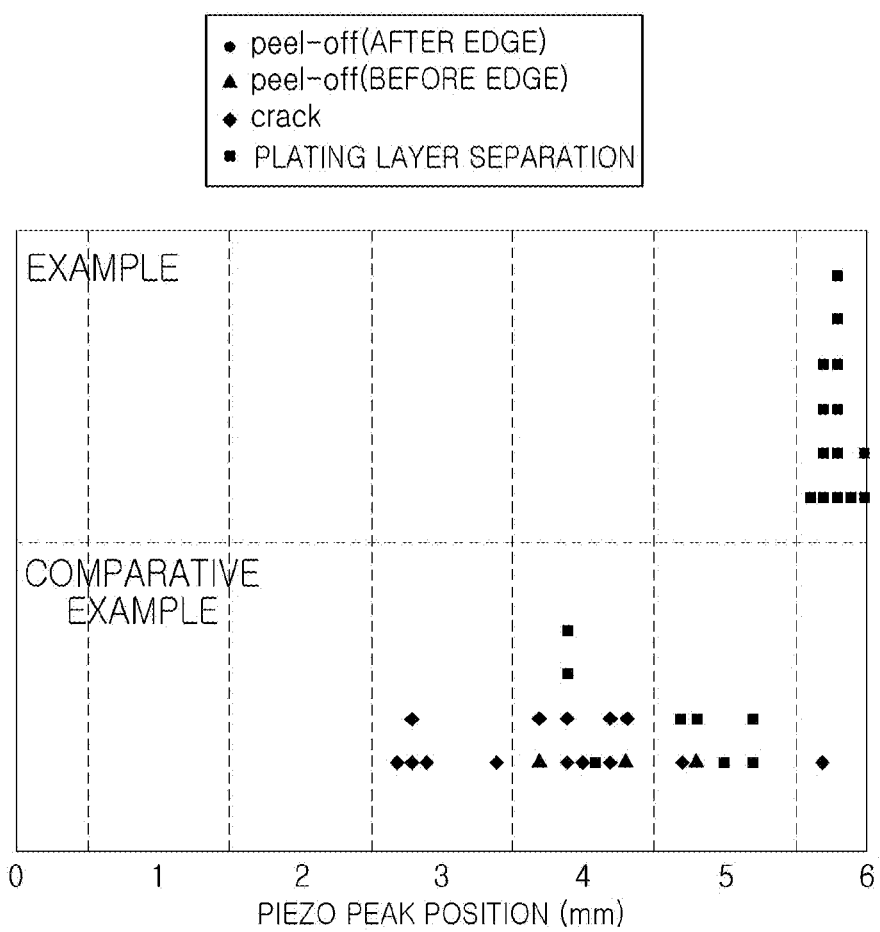
FIG. 9 is a graph illustrating a comparison of the results of a warpage strength test of a conventional multilayer capacitor without an insulating layer and a multilayer capacitor according to another embodiment of the present disclosure.

FIG. 9 is a graph illustrating a comparison of the results of a warpage strength test of a conventional multilayer capacitor without an insulating layer and a multilayer capacitor according to another embodiment of the present disclosure.

Here, Comparative example illustrates a multilayer capacitor in which the external electrode includes a sintered layer and a conductive resin layer and does not have an insulating layer, and Example illustrates a multilayer capacitor having the external electrode structure of FIG. 6 and including an insulating layer.

In the Comparative example, a thickness of the sintered layer is 10 μm, and a thickness of the conductive resin layer is 35 μm. In the Example, the thickness of the sintered layer is 10 μm, the thickness of the conductive resin layer is 35 μm, and the thickness of the insulating layer is 25 μm.

In this case, the number of multilayer capacitors was used in each sample is 30, and the multilayer capacitor is manufactured so that the length in the X direction was 3.2 mm, the length in the Y direction was 1.6 mm, and the length in the Z direction was 1.6 mm.

Figure 8:
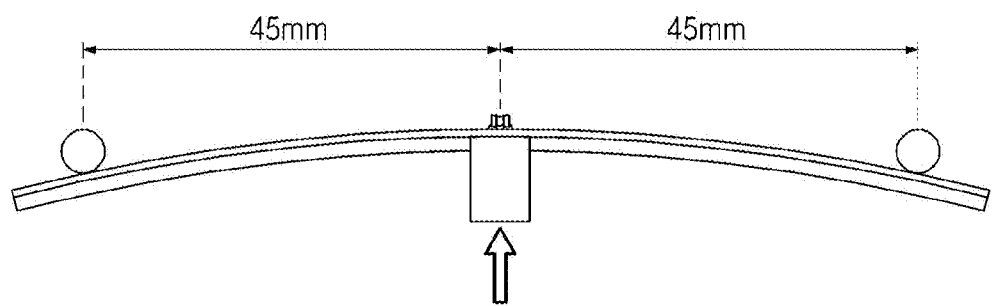
FIG. 8 is a schematic diagram schematically illustrating a warpage strength test method.

As shown in FIG. 8, it is observed that a multilayer capacitor is mounted on a PCB, and the substrate is bent by about 1 to 6 mm to cause a peel-off phenomenon in which the conductive resin layer of the external electrode is separated from the capacitor body or a crack in which a part of the capacitor body is broken or whether the plating layer is separated, which is shown in FIG. 9.

Referring to FIG. 9, in the case of the Comparative Example, cracks occurred from 2.5 mm, and peeling-off and separation of the plating layer occurred at 3.5 mm.

On the other hand, in the case of the embodiment, peel-off, crack and plating layer separation did not occur up to 5.5 mm, peel-off and crack did not occur even at 6 mm, and defects in separation of the plating layer occurred only in 14 out of 30.

Accordingly, it can be seen that the multilayer capacitor having the structure including the insulating layer of the present disclosure has superior warpage strength characteristics compared to the conventional multilayer capacitor.

Figure 10:
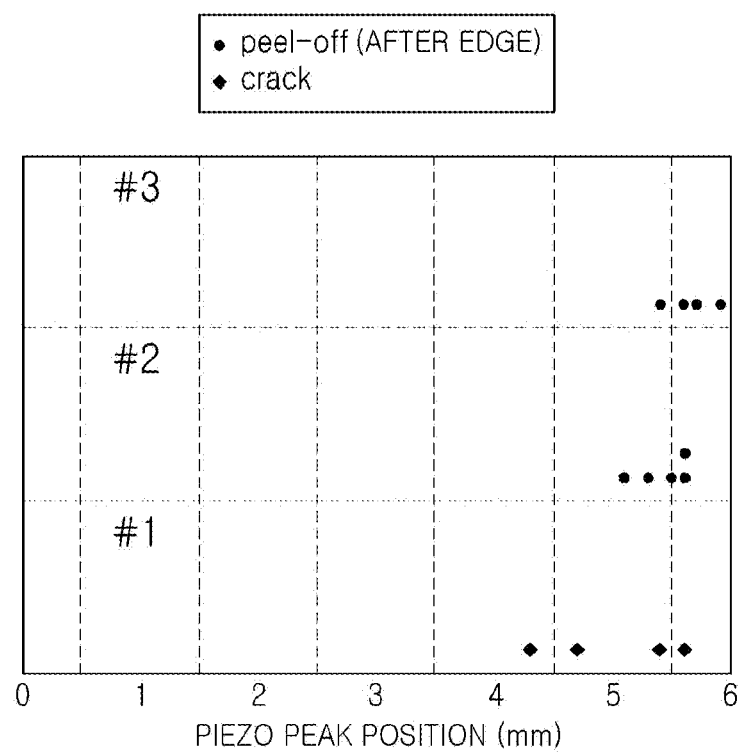
FIG. 10 is a graph illustrating a comparison of results of a warpage strength test of a multilayer capacitor according to a thickness of an insulating layer in another embodiment of the present disclosure.

FIG. 10 is a graph illustrating a comparison of results of a warpage strength test of a multilayer capacitor according to a thickness of a multilayer capacitor in another embodiment of the present disclosure.

The Example applied here is illustrates a multilayer capacitor having an external electrode structure of FIG. 6 and including an insulating layer.

In this case, the thickness of the sintered layer is 10 μm, the thickness of the conductive resin layer is 35 μm, and the maximum thickness of the insulating layer is 9.34 μm for #1, 11.57 μm for #2, and 16.34 μm for #3.

The number of multilayer capacitors used in each sample is 30, and the multilayer capacitor is manufactured so that the length in the X direction is 3.2 mm, the length in the Y direction is 1.6 mm, and the length in the Z direction is 1.6 mm.

As shown in FIG. 8, it is observed that a multilayer capacitor is mounted on a PCB, and the substrate is bent by 6 mm to cause a peel-off phenomenon in which the conductive resin layer of the external electrode is separated from the capacitor body or a crack in which a part of the capacitor body is broken or whether the plating layer is separated, which is shown in FIG. 10.

Referring to FIG. 10, in the case of #1, cracks occurred when it exceeded 4 mm, in the case of #2 and #3, defects did not occur up to 5 mm, and some peel-off phenomena occurred even at 6 mm, but no cracks occurred.

Therefore, it can be seen that the maximum thickness of the desirable insulating layer to prevent the occurrence of cracks is the insulating layer to prevent the occurrence of cracks being 10 μm or more.

As set forth above, according to an embodiment of the present disclosure, an insulating layer may be formed to cover a portion of the band portion of the sintered layer, and the remaining portion of the band portion may not be covered by the insulating layer, but may be covered by the plating layer, such that there is an effect of improving bonding strength characteristics of the multilayer capacitor while securing a certain level of bonding strength of external electrodes.

While exemplary embodiments have been shown and described above, it will be apparent to those skilled in the art that modifications and variations could be made without departing from the scope of the present invention, as defined by the appended claims.

What is claimed is:

1. A multilayer capacitor, comprising:
   a capacitor body including first and second surfaces opposing each other, third and fourth surfaces connected to the first and second surfaces and opposing each other, and fifth and sixth surfaces connected to the first and second surfaces, connected to the third and fourth surfaces, and opposing each other, and including a dielectric layer alternately stacked in a first direction connecting the first and second surfaces, a first internal electrode being in contact with the third surface, and a second internal electrode being in contact with through the fourth surface;
   first and second external electrodes respectively disposed on both end portions of the capacitor body, in a second direction connecting the third and fourth surfaces, and comprising first and second sintered layers respectively connected to the first and second internal electrodes, and first and second plating layers respectively disposed above the first and second sintered layers, respectively;
   an insulating layer disposed on the capacitor body, to cover an end portion of a first band portion of the first sintered layer and an end portion of a second band portion of the second sintered layer; and
   a first conductive resin layer covering the first sintered layer and one end portion of the insulating layer, and a second conductive resin layer covering the second sintered layer and the other end portion of the insulating layer,
   wherein the thickest portion of the insulating layer is 10 μm or more,
   wherein a portion of the first band portion of the first sintered layer extends, in a direction away from the insulating layer, from an edge of an interface between the first sintered layer and the insulating layer,
   wherein a portion of the second band portion of the second sintered layer extends, in another direction away from the insulating layer, from an edge of an interface between the second sintered layer and the insulating layer, wherein the first and second plating layers are disposed to cover the first and second conductive resin layers, respectively, wherein the insulating layer extends between the first sintered layer and the first conductive resin layer and between the second sintered layer and the second conductive resin layer.

2. The multilayer capacitor of claim 1, wherein the first sintered layer comprises a first connection portion disposed on the third surface of the capacitor body, and the first band portion extending from the first connection portion to portions of the first, second, fifth, and sixth surfaces of the body, wherein the second sintered layer comprises a second connection portion disposed on the fourth surface of the capacitor body, and the second band portion extending from the second connection portion to portions of the first, second, fifth, and sixth surfaces of the capacitor body.

3. The multilayer capacitor of claim 2, wherein a space between the first connection portion and the first band portion in the first sintered layer is defined as a first corner portion, and a space between the second connection portion and the second band portion in the second sintered layer is defined as a second corner portion, wherein the first corner portion is covered by the first plating layer, and the second corner portion is covered by the second plating layer.

4. The multilayer capacitor of claim 2, wherein the first plating layer is disposed on the first connection portion and the extending portion of the first band portion extending from the edge of the interface between the first sintered layer and the insulating layer, wherein the second plating layer is disposed on the second connection portion and the extending portion of the second band portion extending from the edge of the interface between the second sintered layer and the insulating layer.

5. The multilayer capacitor of claim 2, wherein the end portion of the first band portion is disposed between the insulating layer and the capacitor body, wherein the end portion of the second band portion is disposed between the insulating layer and the capacitor body.

6. The multilayer capacitor of claim 1, wherein the first and second conductive resin layers comprise a conductive metal and a base resin.

7. The multilayer capacitor of claim 1, wherein the first and second conductive resin layers comprise a plurality of metal particles, an intermetallic compound, and a base resin.

8. A mounting substrate of a multilayer capacitor, comprising:

a substrate having first and second electrode pads on an upper surface; and a multilayer capacitor mounted on the substrate so that first and second plating layers of the multilayer capacitor are connected to the first and second electrode pads, respectively, wherein the multilayer capacitor comprises:

a capacitor body including first and second surfaces opposing each other, third and fourth surfaces connected to the first and second surfaces and opposing each other, and fifth and sixth surfaces connected to the first and second surfaces, connected to the third and fourth surfaces, and opposing each other, and including a dielectric layer alternately stacked in a first direction connecting the first and second surfaces, a first internal electrode being in contact with the third surface, and a second internal electrode being in contact with the fourth surface;

first and second external electrodes respectively disposed on both end portions of the capacitor body in a second direction, connecting the third and fourth surfaces, and comprising first and second sintered layers respectively connected to the first and second internal electrodes, and first and second plating layers respectively disposed above the first and second sintered layers, respectively;

an insulating layer disposed on the capacitor body, to cover an end portion of a first band portion of the first sintered layer and an end portion of a second band portion of the second sintered layer; and a first conductive resin layer covering the first sintered layer and one end portion of the insulating layer, and a second conductive resin layer covering the second sintered layer and the other end portion of the insulating layer, wherein the thickest portion of the insulating layer is 10 μm or more, wherein a portion of the first band portion of the first sintered layer extends, in a direction away from the insulating layer, from an edge of an interface between the first sintered layer and the insulating layer, wherein a portion of the second band portion of the second sintered layer extends, in another direction away from the insulating layer, from an edge of an interface between the second sintered layer and the insulating layer, wherein the first and second plating layers are disposed to cover the first and second conductive resin layers, respectively, wherein the insulating layer extends between the first sintered layer and the first conductive resin layer and between the second sintered layer and the second conductive resin layer.

9. The mounting substrate of the multilayer capacitor of claim 8, wherein the first sintered layer comprises a first connection portion disposed on the third surface of the capacitor body, and the first band portion extending from the first connection portion to portions of the first, second, fifth, and sixth surfaces of the capacitor body, wherein the second sintered layer comprises a second connection portion disposed on the fourth surface of the capacitor body, and the second band portion extending from the second connection portion to portions of the first, second, fifth and sixth surfaces of the capacitor body.

10. The mounting substrate of the multilayer capacitor of claim 9, wherein a space between the first connection portion and the first band portion in the first sintered layer is defined as a first corner portion, and a space between the second connection portion and the second band portion in the second sintered layer is defined as a second corner portion, wherein the first corner portion is covered by the first plating layer, and the second corner portion is covered by the second plating layer.

11. The mounting substrate of the multilayer capacitor of claim 9, wherein the first plating layer is disposed on the first connection portion and the extending portion of the first band portion extending from the edge of the interface between the first sintered layer and the insulating layer,
wherein the second plating layer is disposed on the second connection portion and the extending portion of the second band portion extending from the edge of the interface between the second sintered layer and the insulating layer.

12. The mounting substrate of the multilayer capacitor of claim 9, wherein the end portion of the first band portion is disposed between the insulating layer and the capacitor body, and the end portion of the second band portion is disposed between the insulating layer and the capacitor body.

13. A multilayer capacitor, comprising:
a capacitor body including first and second surfaces opposing each other, third and fourth surfaces connected to the first and second surfaces and opposing each other, and fifth and sixth surfaces connected to the first and second surfaces, connected to the third and fourth surfaces, and opposing each other, and including a dielectric layer alternately stacked in a first direction connecting the first and second surfaces, a first internal electrode being in contact with the third surface, and a second internal electrode being in contact with the fourth surface;
first and second external electrodes respectively disposed on both end portions of the capacitor body, in a second direction connecting the third and fourth surfaces, and comprising first and second sintered layers respectively connected to the first and second internal electrodes, and first and second plating layers respectively disposed above the first and second sintered layers, respectively;
an insulating layer disposed on the capacitor body, to cover an end portion of a first band portion of the first sintered layer and an end portion of a second band portion of the second sintered layer; and
a first conductive resin layer covering the first sintered layer and one end portion of the insulating layer, and a second conductive resin layer covering the second sintered layer and the other end portion of the insulating layer,
wherein a portion of the first band portion of the first sintered layer extends, in a direction away from the insulating layer, from an edge of an interface between the first sintered layer and the insulating layer,
wherein a portion of the second band portion of the second sintered layer extends, in another direction away from the insulating layer, from an edge of an interface between the second sintered layer and the insulating layer,
wherein a thickness of a portion of the insulating layer decreases from a center portion of the insulating layer to an end of the first sintered layer where the insulating layer and the first sintered layer meet or an end of the second sintered layer where the insulating layer and the second sintered layer meet,
wherein the portion of the insulating layer is in direct contact with the capacitor body,
wherein the first and second plating layers are disposed to cover the first and second conductive resin layers, respectively,
wherein the insulating layer extends between the first sintered layer and the first conductive resin layer and between the second sintered layer and the second conductive resin layer.

14. The multilayer capacitor of claim 13, wherein the thickness of the portion of the insulating layer, located at the center portion in the second direction, is 10 µm or more.

15. The multilayer capacitor of claim 13, wherein the first sintered layer comprises a first connection portion disposed on the third surface of the capacitor body, and the first band portion extending from the first connection portion to portions of the first, second, fifth, and sixth surfaces of the body,
wherein the second sintered layer comprises a second connection portion disposed on the fourth surface of the capacitor body, and the second band portion extending from the second connection portion to portions of the first, second, fifth, and sixth surfaces of the capacitor body.

16. The multilayer capacitor of claim 15, wherein an end portion of the first band portion is disposed between the insulating layer and the capacitor body,
wherein an end portion of the second band portion is disposed between the insulating layer and the capacitor body,
wherein both end portions of the insulating layer are in contact with the first and second plating layers, respectively.

17. The multilayer capacitor of claim 8, wherein the first and second conductive resin layers comprise a conductive metal and a base resin.

* * * * *